United States Patent [19]

Ameen et al.

[11] 4,120,843

[45] Oct. 17, 1978

[54] STRIPPABLE SOLDER MASK MATERIAL COMPRISING POLYSULFONE, SILICON DIOXIDE FILLER, AND SOLVENT

[75] Inventors: Joseph G. Ameen, Apalachin; Glenn V. Elmore, Vestal; Anthony E. Peter, Endicott, all of N.Y.

[73] Assignee: International Business Machines Corporation, Armonk, N.Y.

[21] Appl. No.: 894,673

[22] Filed: Apr. 10, 1978

Related U.S. Application Data

[63] Continuation-in-part of Ser. No. 671,898, Mar. 29, 1976, abandoned.

[51] Int. Cl.$^2$ ...................... B23K 35/22; C08G 75/20
[52] U.S. Cl. .................... 260/33.8 R; 148/22; 228/118; 228/180 R; 228/215; 260/37 R; 427/58; 427/259; 428/411
[58] Field of Search ............... 260/33.8 R, 37 R, 49, 260/79.3 A; 427/58, 259; 428/411; 228/118, 180 R, 215; 148/22

[56] References Cited

U.S. PATENT DOCUMENTS

| | | | |
|---|---|---|---|
| 2,250,940 | 7/1941 | Zahn | 228/118 |
| 2,668,160 | 2/1954 | Roney | 260/79.3 A |
| 2,885,601 | 5/1959 | Pessel | 228/118 |
| 2,943,077 | 6/1960 | de Jong | 260/79.3 A |
| 3,133,346 | 5/1964 | Allen | 228/118 |
| 3,249,910 | 5/1966 | Venn et al. | 228/118 |
| 3,268,653 | 8/1966 | McNutt | 228/118 |
| 3,297,640 | 1/1967 | Caldwell | 260/79.3 A |
| 3,431,240 | 3/1969 | Vogel | 260/33.8 R |
| 3,536,665 | 10/1970 | Pietrusza | 260/33.8 R |
| 3,663,507 | 5/1972 | Yogel | 260/37 R |
| 3,708,454 | 1/1973 | Barlow | 260/37 R |
| 3,712,932 | 1/1973 | Balme | 260/33.8 R |
| 3,737,409 | 6/1973 | Fox | 260/33.8 R |
| 3,758,436 | 9/1973 | Jones | 260/37 R |
| 3,773,704 | 11/1973 | Hall | 260/33.8 R |
| 3,861,951 | 1/1975 | Staniland | 260/49 |
| 3,890,287 | 6/1975 | Moore | 260/79.3 A |
| 3,939,119 | 2/1976 | O'Shea | 260/49 |

*Primary Examiner*—John D. Smith
*Attorney, Agent, or Firm*—Cyril A. Krenzer

[57] ABSTRACT

A polysulfone base stop resist material to protect gold thermocompression bonding sites on a circuit module during a solder dipping operation. Along with the thermoplastic, thermostable strippable base of polysulfone, the resist includes a solvent for the polysulfone and a filler which holds the melted polysulfone in place during the solder dipping operation.

4 Claims, No Drawings

STRIPPABLE SOLDER MASK MATERIAL COMPRISING POLYSULFONE, SILICON DIOXIDE FILLER, AND SOLVENT

CROSS REFERENCE TO RELATED APPLICATION

This application is a continuation-in-part of application Ser. No. 671,898 filed Mar. 29, 1976 now abandoned.

BACKGROUND OF THE INVENTION

1. Field of the Invention

The present invention is directed to a method and material for protecting bonding sites on a module during a solder dipping operation, and more particularly relates to an improved strippable solder mask for such bonding sites.

2. Prior Art

In the manufacture of pin electronics modules, for example in a multilayer ceramic hybrid configuration, there are gold thermocompression bonding sites to which leads are connected to provide the interconnection between the modules and the external world. In the process of producing the module, a solder dipping operation occurs for the purpose of connecting the pins to the module circuitry. For some substrates the chip is then connected to the circuitry via thermocompression bonding of wires from the chip to gold pads on the circuitry. During the solder dipping operation, it is important that the gold thermocompression bonding sites on the module be protected in a manner such that after the solder dipping operation, the gold bonding sites can be cleaned and used to provide the above mentioned interconnections. Conventional stop resist materials, such as positive and negative photoresists or sodium silicate, have been used to mask the bonding sites. However, with such materials the bonding sites have often experienced problems either due to poor solder protection or alternatively to incomplete strippability prior to the wire bonding that subsequently occurs. When the poor solder protection occurs, some of the solder penetrates to the bonding sites which adversely affects the subsequent wire bonding to the site. Similarly, when the mask material does not completely strip away prior to wire bonding, the wire bond will have a diminished bonding strength.

OBJECTS AND SUMMARY OF THE INVENTION

Accordingly, it is a primary object of the present invention to provide a solder mask for protecting gold thermocompression bonding sites during a soldering operation which overcomes the foregoing disadvantages of the prior art.

It is a further object of the present invention to provide a solder mask for protecting gold thermocompression bonding sites which is completely strippable prior to wire bonding.

It is yet another object of the present invention to provide a solder mask for gold thermocompression bonding sites which provides complete protection for the bonding sites during a solder dipping operation.

The foregoing and other objects and advantages are accomplished according to one aspect of the present invention wherein a solder mask material is composed basically of a thermoplastic, thermostable strippable base of polysulfone, a solvent such as monochlorobenzene for the polysulfone, and a filler such as zinc oxide, calcium carbonate or silicon dioxide particles to hold the melted polysulfone in place during the solder dipping operation. The material is screened onto the ceramic module at the desired sites following which the module is baked for a prescribed period of time at elevated temperatures. Then after the module is subjected to the solder dipping, the mask material can be removed by soaking the module in methylene chloride followed by a trichloroethylene vapor degrease.

DESCRIPTION OF THE PREFERRED EMBODIMENTS

The foregoing and other objects, features and advantages of the invention will be apparent from the following more particular description of the preferred embodiments of the invention.

The solder mask according to the present invention is composed of three basic ingredients. A principal ingredient is polysulfone which is a thermoplastic, thermostable strippable base material. A second ingredient is a solvent for the polysulfone such as chlorobenzene, orthodichlorobenzene, methylene chloride or trichloroethylene. The chlorobenzene or orthodichlorobenzene are preferred solvents because of their higher boiling points. The third ingredient required in the basic mask material is a filler necessary to hold the polysulfone in place during the soldering operation. This is due to the fact that at the elevated temperatures encountered during soldering, the polysulfone is in a molten state. Typical fillers which can be used are zinc oxide, calcium carbonate or finely divided particles of silicon dioxide.

EXAMPLE I

A first solder mask material is produced by mixing 30 grams of polysulfone with 100 milliliters of orthodichlorobenzene. After the polysulfone is dissolved in the orthodichlorobenzene, approximately 8 grams of finely divided silicon dioxide are added and the composition is mixed until homogenous. Stirring is a preferred way to do the mixing, using caution to keep air out of the mixture.

This material is then appropriately screened onto the bonding sites on the module and the module is baked for about fifteen minutes at 175° C. Than after treating the module by the solder dipping, the resist material is removed by soaking the module in methylene chloride for two minutes followed by a trichloroethylene vapor degrease.

EXAMPLE II

A second formulation for the strippable solder mask according to the present invention consists of dissolving 30 grams of polysulfone in 100 milliliters of monochlorobenzene. After the polysulfone is dissolved, the filler comprising 56 grams of zinc oxide is added and the material is mixed until homogenous.

The second composition is then screened and baked as in Example I and follows the same basic procedures.

A preferred polysulfone is manufactured by the Union Carbide Corporation under the trade name "UDEL" and designated P-1700. It is a tough, rigid, high-strength thermoplastic which is transparent and light-amber in color. A preferred filler material is a silica material manufactured by the Cabot Corporation under the trade name "CAB-O-SIL." It is 99% silicon dioxide having a particle size varying between 0.007 and 0.012 microns and a specific gravity of about 2.2. It has a very low moisture content and a pH of between 3.5 and 4.2 in a 4% aqueous dispersion.

It has been found that using the formulations for a strippable solder mask according to the present invention, the mask has been highly impervious to solder penetration, yet has shown extremely good strippability. In the subsequent wire bonding of the interconnectng wires, the gold pads have shown an average wire pull of 2.8 grams, which is deemed to be excellent for pin electronics.

It is found that the combinations of materials can vary between selected ranges. In particular, for Example I, there can be between 20 and 40 grams of polysulfone per 100 milliliters of solvent and between 5 and 10 grams of finely divided silicon dioxide or colloidal silica. In Example II, there can be between 20 and 40 grams of polysulfone per 100 milliliters of solvent and between 50 and 100 grams of zinc oxide. Obviously the solvents and/or fillers of Examples I and II can be interchanged and other fillers such as, for example, between 50 and 70 grams of calcium carbonate can be used in place of the above described fillers in Examples I and II. Still other variations will be apparent to those skilled in the art.

While the invention has been particularly shown and described with reference to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A solder mask material operative to protect gold thermocompression bonding sites on a ceramic module during a solder dipping operation, said mask material comprising a thermoplastic, thermostable strippable base of polysulfone, a solvent for the polysulfone, said solvent chosen from the group consisting of orthodichlorobenzene, monochlorobenzene, methylene chloride and trichloroethylene, and a filler of finely divided silicon dioxide particles, said filler being operative to hold the molten polysulfone in place during the solder dipping operation.

2. The invention according to claim 1 wherein there is between 20 and 40 grams of polysulfone per 100 miliiliters of solvent.

3. The invention according to claim 1 wherein said filler consists of between 5 and 10 grams of finely divided silicon dioxide particles per 100 milliliters of solvent.

4. A strippable solder mask material operative to protect gold thermocompression bonding sites on a ceramic module during a solder dipping operation, said mask material comprising 30 grams of polysulfone dissolved in 100 milliliters of orthodichlorobenzene and mixed with 8 grams of finely divided particles of silicon dioxide.

* * * * *